(12) United States Patent
Hsuan et al.

(10) Patent No.: US 6,236,109 B1
(45) Date of Patent: May 22, 2001

(54) MULTI-CHIP CHIP SCALE PACKAGE

(75) Inventors: Min-Chih Hsuan, Hsinchu; Cheng-Te Lin, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/241,625

(22) Filed: Feb. 1, 1999

(51) Int. Cl.[7] .................................................... H01L 23/48
(52) U.S. Cl. ........................ 257/688; 257/623; 257/701; 257/706; 257/707; 257/777; 257/778; 257/668; 257/677; 257/690; 257/713
(58) Field of Search ................... 257/677, 668, 257/688, 777–778, 707, 713, 701–706, 623, 690

(56) References Cited

U.S. PATENT DOCUMENTS

| | | | |
|---|---|---|---|
| 5,182,631 | * 1/1993 | Tomimuro et al. | 257/664 |
| 5,477,082 | * 12/1995 | Buckley et al. | 257/679 |
| 5,757,080 | * 5/1998 | Sota | 257/777 |
| 5,790,384 | * 8/1998 | Ahmad et al. | 361/760 |
| 5,814,882 | * 9/1998 | Shimada et al. | 257/704 |
| 5,901,041 | * 5/1999 | Davies et al. | 361/704 |
| 5,936,305 | * 8/1999 | Akram | 257/723 |
| 6,054,337 | * 4/2000 | Solberg | 438/107 |

FOREIGN PATENT DOCUMENTS

402122533 * 5/1990 (JP) ............................................ 21/60

* cited by examiner

*Primary Examiner*—Tom Thomas
*Assistant Examiner*—Nitin Parekh (57) ABSTRACT

A multi-chip chip scale package. A film carrier is in use. Two chips with different sizes can be disposed on the same film carrier. The flip chip technique is used to arrange each chip on each side of the film carrier face to face. A bump is formed on each chip to electrically connect with the film carrier. An insulation material is infilled between the chips to leave one side of each chip exposed. The conductive wires of the film carrier are connected with the chip directly without going through other carrier.

19 Claims, 6 Drawing Sheets

MULTI-CHIP CHIP SCALE PACKAGE

BACKGROUND OF THE INVENTION

1. Field of the Invention

The invention relates to a semiconductor packaging structure, and more particularly, to a multi-chip chip scale package (CSP).

2. Description of the Related Art

As the technology of semiconductor fabrication grows more and more advanced, the relevant techniques have to be further developed to coordinate the requirements of the semiconductor devices. The fabrication process of a semiconductor device typically includes three stages. In the first stage, an epitaxy technique is used for the formation of a semiconductor substrate. Semiconductor devices such as metal-oxide semiconductor (MOS) and multilevel interconnection are fabricated on the substrate in the second stage. The third stage is the packaging process. It is now a leading trend for fabricating a device or an electronic product with a thin, light, and small dimension, that is, with a higher integration for semiconductor devices. In terms of packages, many techniques such as chip scale package, multi-chip module (MCM) have been developed to obtain a high integration. The development of the fabrication technique with a line width of 0.18 μm has evoked a great interest and intensive research to further decrease the package volume. It is thus one of the very important package techniques to arrange more than one chips into a single package. In a multi-chip package, chips of processor, memory, including dynamic random access memory (DRAM) and flash memory, and logic circuit can be packed together in a single package to reduce the fabrication cost and the packaging volume. Furthermore, the signal transmission path is shortened to enhance the efficiency. The multi-chip IC packaging technology may also be applied to a multi-chip system with variable functions and operation frequencies, for example, 1. A system comprises memory chips, microprocessors, resistors, capacitors, and inductors.

2. A system comprises memory chips (DRAM), logic circuit chips, and memory chips (Flash memory), 3. A system comprises analog chips, logic circuit chips, memory chips (including DRAM, SRAM, Flash memory), resistor, capacitor, and inductor.

Figure 1:
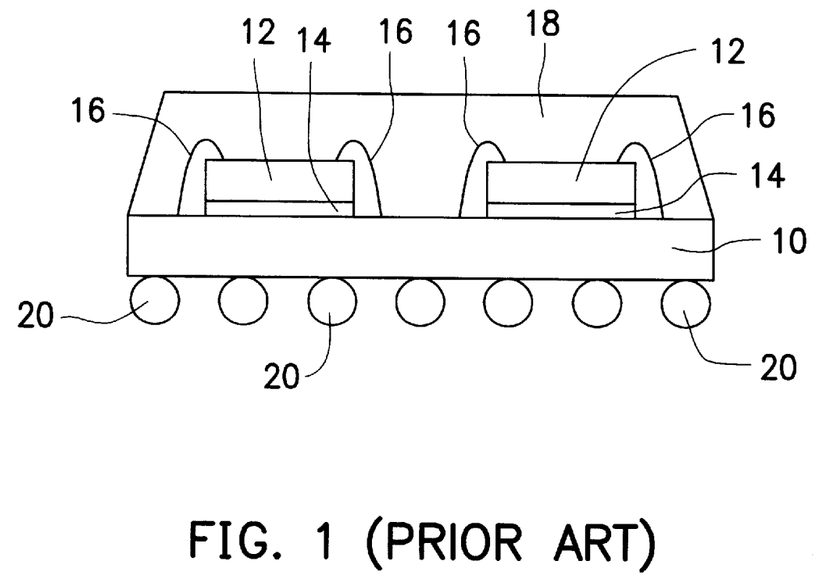
FIG. 1 shows a conventional multi-chip module package.

In FIG. 1, a conventional multi-chip module is shown. A multi-level printed circuit board (PCB) is typically applied as a substrate of the to the carrier of a multi-chip module. More than one chips 12 are adhered on the substrate 10 by insulation glue 14. The bonding pads on the chip 12 are electrically connected with the terminals on the substrate 10 by conductive wires 16. In addition to wire bonding, the connection between the chip 12 and the substrate 10 can also be established by flip chip or controlled collapse chip connection (C4) with the formation of a bump. A resin 18 is used to seal the chip 12, and the electrical connection between the whole package and a printed circuit board can be achieved by ball grid array (BGA) which use solder balls 20 to connect the terminals on the printed circuit board. The drawback of this conventional multi-chip module includes a large surface is occupied since chips are packaged on a same side of surface. Therefore, the volume of the package is large, and the signal path between chips is long. In addition, though the volume of the package can be reduced by using flip chip technique to achieve the connection between the chip and the carrier, a known good die (KGD) method has to be used for testing. A low yield and a high cost are thus resulted.

Figure 2:
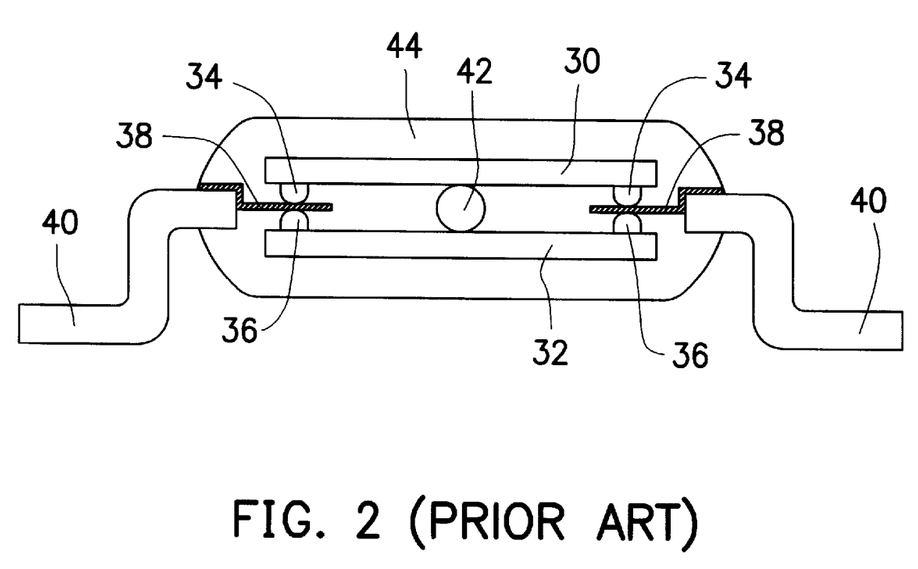
FIG. 2 is a cross sectional view showing a conventional face-to-face multi-chip module package.

To further shrink the volume of package, a face to face multi-chip package is disclosed in U.S. Pat. No. 5,331,235. In FIG. 2, this multi-chip package comprises two chips 30 and 32 disposed face to face by way of tape automatic bonding (TAB). For the part of inner lead bonding (ILB), two chips 30, 32 having bumps 34, 36 to electrically connect the film carrier 38. In the part of outer lead bonding (OLB), the chips 30, 32 connect to a lead frame 40. A solder ball 42 is formed between the chips 30, 32. The chips 30, 32, the film carrier 38 and the lead frame 40 are then molded resin 44. This multi-chip package uses tape automatic bonding technique. The electrical connection between chips and printed circuit board is achieved by the installation of a lead frame or other carriers. The signal transmission path is lengthened. In addition, a large thickness and surface area are resulted by using the molding material (resin) of package. The applicability is reduced, and the heat dissipation is not effective. Moreover, this kind of package can not be applied to high frequency products.

SUMMARY OF THE INVENTION

The invention provides a multi-chip chip scale package with a reduced thickness and surface area. The surface area is substantially the same or slightly bigger than the largest chip being packaged therein.

The multi-chip chip scale package has a shortened signal transmission path to enhance the performance of the chips.

The multi-chip chip scale package mentioned above has an enhanced performance of heat dissipation. The heat dissipation can be performed by ways of metal plate or printed circuit on a printed circuit board, or alternatively, by an additional heat dissipation apparatus.

In addition, the test of chip package can be performed during package process without using known-good die method.

To achieve the above-mentioned objects and advantages, a multi-chip chip scale package is provided. A film carrier is used to carry two chips in different sizes. Using flip chip technique, these two chips are disposed face-to-face on two sides of the film carrier. The chips each has a bump connecting to the film carrier. An insulation material is infilled between the chips, while the other side of each of the chips is bared. Accordingly, the thickness of the package is reduced, and the performance of heat dissipation is enhanced. Moreover, conductive wires are formed on the film carrier to directly connect an external signal. The signal transmission path is shortened with going through an additional carrier.

While arranging the multi-chip chip scale package on a printed circuit board, the chip may has a side directly connected to a printed circuit or metal plate on the printed circuit board to provide an advantageous the heat dissipation. An additional heat dissipation apparatus may also installed on a surface of the other chip in the far end of the printed circuit board. The heat dissipation effect is thus further enhanced. In addition, at least one locating hole is formed on the insulation film and filled by the insulation material, so that the chip can be connected to the film carrier more stably. Thus, an improved packaging quality and an enhanced reliability are obtained.

Both the foregoing general description and the following detailed description are exemplary and explanatory only and are not restrictive of the invention, as claimed.

DESCRIPTION OF THE PREFERRED EMBODIMENTS

During the process of packages, several stages are typically included:

1) Selection of carriers: types of chips have to be selected according specific equirement, for example, lead frame, film carrier, or printed circuit board. The film carriers commonly used for the technique of tape automatic bonding (TAB);

2) Electrical connections between chips and carriers: currently, techniques such as wire bonding, film automatic bonding, and flip chip or controlled collapse chip connection (C4) have been developed and widely used; and 3) Package and device sealing: chips and carriers are covered or sealed by resin, ceramic or other packaging material to protect the devices on the chips and the connections between the chips and the carriers.

Figure 3:
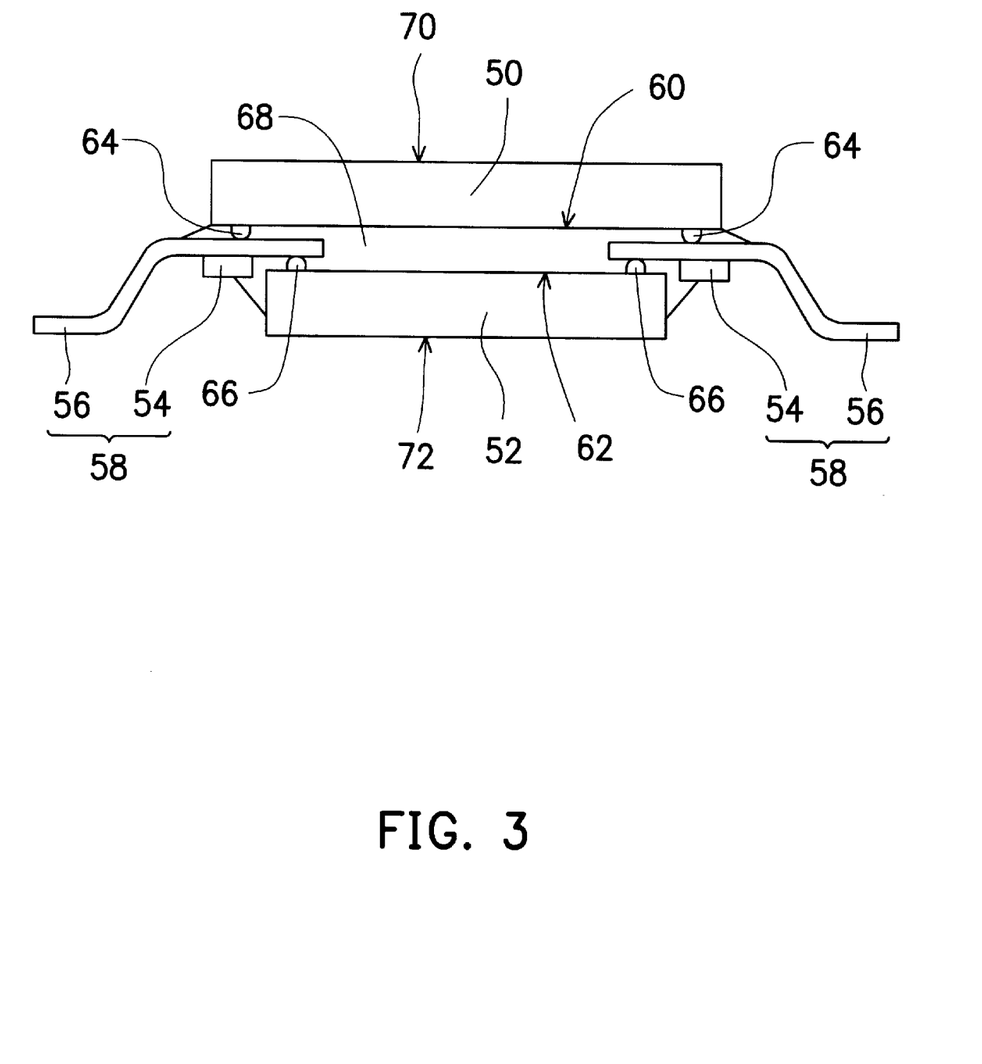
FIG. 3 is a cross sectional view showing a multi-chip chip scale package in a preferred embodiment according to the invention.

In FIG. 3, a cross sectional view of a multi-chip chip-scale package is shown. In the invention, two chips 50 and 52 with different sizes are packed into one package with a size substantially the same as the bigger one between the chips 50 and 52. For example, the chip 50 has a surface area larger than the surface area of the chip 52 in this example shown as FIG. 3. Chips may include DRAM, ROM, LOGIC or ANALOG circuits, or other devices. Regarding to the selection of carrier, a film carrier 58 is chosen in this embodiment. As shown in the figure, the film carrier 58 comprises an insulation film 54 and conductive wires 56 on the insulation film 54. Since the conductive wires 56 of film carrier 58 have a thinner and narrower dimension compared to conductive wires used in other kinds of carriers, this kind of package can be applied in high frequency device.

The technique of flip chip (or C4) is applied to achieve electrical connection between the chip 50, 52 and the film carrier 58. By the flip chip technique, the thickness of the package can be reduced, and the signal transmission path can be shortened. The chips 50 and 52 may comprise several devices on surfaces 60 and 62 thereof, respectively. Bonding pads (not shown) may be formed on the surfaces 60 and 62, while bumps 64 and 66 are formed on these bonding pads. The chips 50 and 52 are disposed with face 60 to face 62 on opposite sides of the film carrier 58. Via the bumps 64 and 66, the chips 50 and 52 are electrically connected. A preferred allocation is to dispose the chip with a smaller size, that is, the chip 52, in the same side of the film carrier 56 as the insulation film 54. The package can thus be thinner. In addition, the bumps 66 of the chip 52 are preferably connected to the conductive wires 56 at inner ends of the conductive wires 56 beset by the insulation film 54 observed from a cross sectional view thereof. Whereas, the bumps 64 of the chip 50 are preferably connected to the conductive wires 56 at positions corresponding to the insulation film 54 on the other side thereof. In this manner, the misalignment between the bumps 64, 66 and the conductive wires 56 caused by deformation or dislocation due to junction stress is avoided.

In the part of package and device sealing, an insulation material 68 such as epoxy is used and filled between the chips 50 and 52. It is worth mentioning that the insulation material 68 is filled between the chips 50 and 52 only to protect devices on the surfaces 60 and 60 of the chips 50 and 52. Whereas, the other sides 70 and 72 of the chips 50 and 52 are exposed to reduce the package dimension and to provide a heat dissipation path.

Since the conductive wires 56 of the film carrier 58 are used to achieve signal transmission externally without an additional carrier, the signal transmission path is thus reduced. As shown in the figure, the conductive wires 56 are then bent and configured to form the curve or shape as specifically required. The forming process of the conductive wires 56 and the subsequent surface mount technique (SMT) between the conductive wires 56 and a printed circuit board are prior techniques which are not to be introduced here.

Figure 4A:
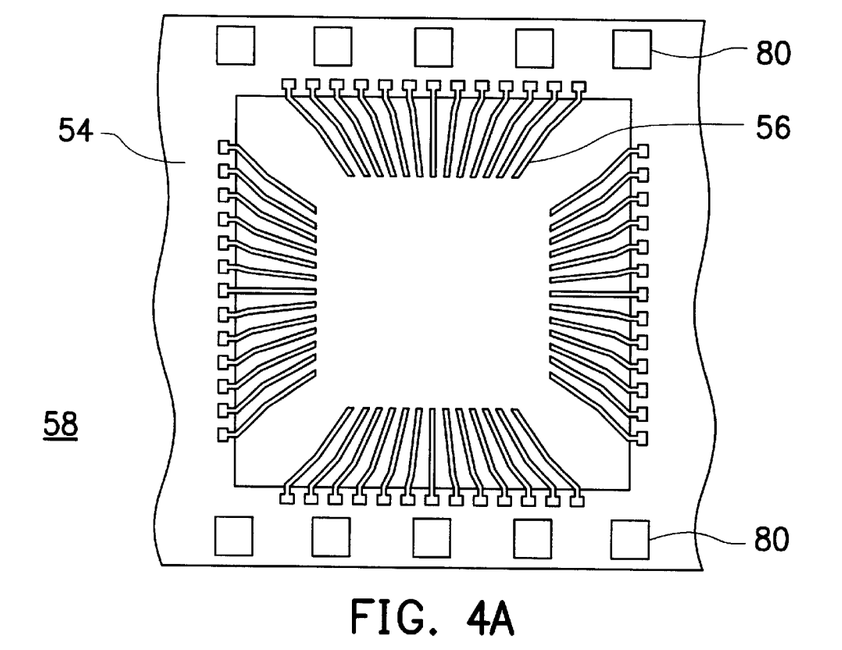
FIG. 4A to FIG. 4D are film carriers in a preferred embodiment according to the invention.

FIG. 4A to FIG. 4D are top views of several examples of film carriers. The film carriers are further introduced here. In FIG. 4A, the film carriers 58 comprises insulation film 54 and conductive wires 56, for example, copper wires, arranged on the insulation film 54. Typically, the conductive wires 56 are in a strip shape and flexible before being packaged. In automatic production, the insulation film 54 has leading holes 80 at two ends thereof to advantage the conveyance of film carrier 58. FIG. 4A shows a film carrier with long lead cantilever wires. Only the outer ends of the conductive wires 56 are in contact with the insulation film 54.

Figure 4B:
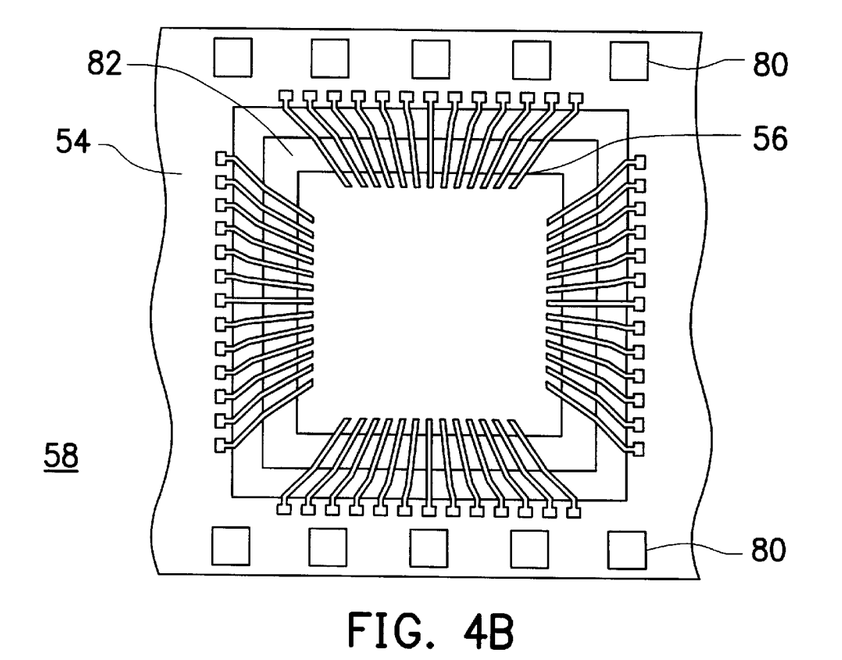
Figure 4C:
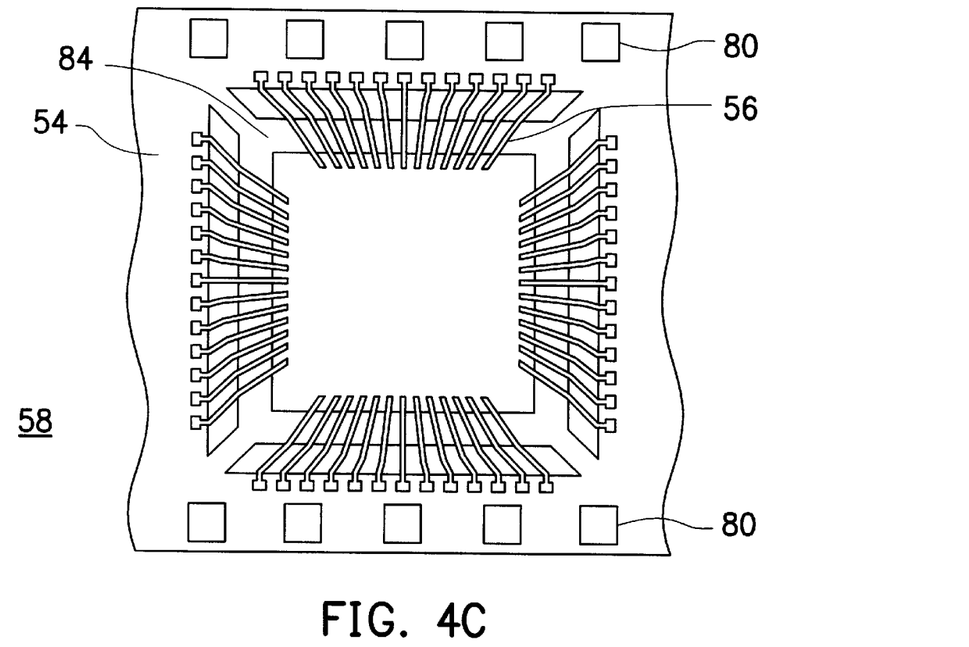

In FIG. 4B, a film carrier 58 having a free-floating ring 82 inside of the insulation film 54 and connected with inner ends of the conductive wires 56. The inner ends of the conductive wires 56 can thus be positioned according to the free-floating ring 82. In FIG. 4C, a film carrier 58 having a corner supported ring 84 inside of the insulation film 54 is shown. The corner supported ring 84 having corners connecting with the insulation film 54. With the aid of the corner supported ring 84, the conductive wires 56 can thus be firmly disposed on the insulation film 54. The materials of both the free-floating ring 82 in FIG. 4B and the corner supported ring 84 in FIG. 4C can be selected from an insulation material, preferably, the material of the insulation film. In additions, both the free-floating ring 82 and the corner supported ring 84 may be taped on the conductive wires 56 or be formed integrally with the insulation film 54.

Figure 4D:
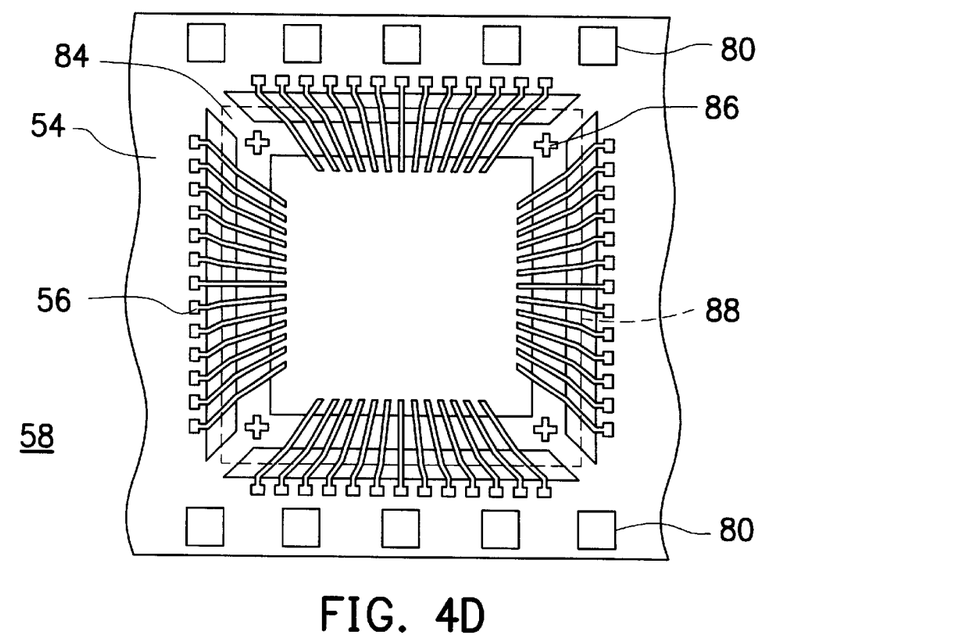
Figure 5:
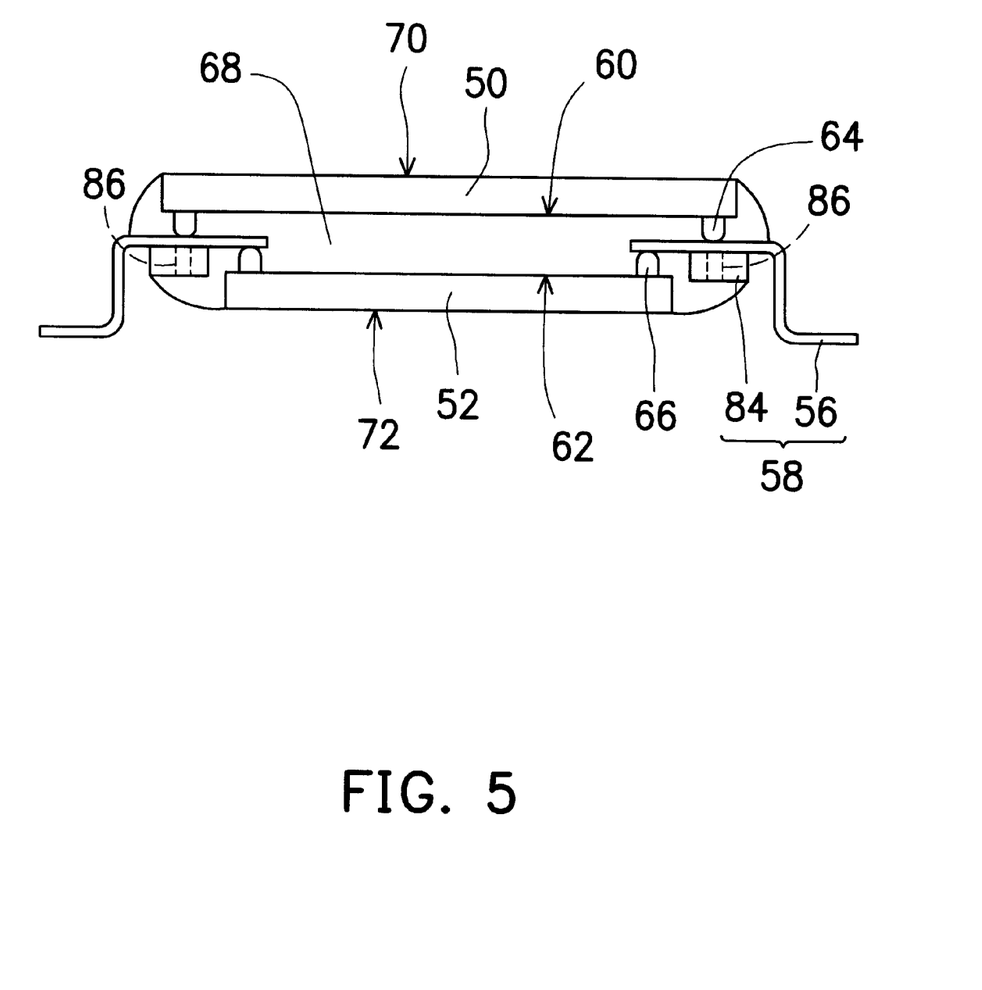
FIG. 5 is a cross sectional view showing a film carrier with locating holes in a preferred embodiment according to the invention.

To improve the fixture of the insulation material 68 filled between the chips 50 and 52 in FIG. 3, an improved film carrier is disclosed in the invention as shown in FIG. 4D. The film carrier 58 comprises a corner supported ring 84 similar to FIG. 4C. On the corners of the corner supported ring 84, locating holes 86 in a shape, for example, a cross shape, round shape, rectangular shape, or other geometric shape, are formed. In FIG. 5, while the insulation material 68 is filled between the chips 50 and 52 within a range as shown as the dash-line frame 88, the locating holes 86 are filled with the insulation material 68. As a consequence, the fixture of the insulation material 68 is improved, and the fixing effect between the chips 50, 52 and the film carrier 58 is enhanced.

Figure 6A:
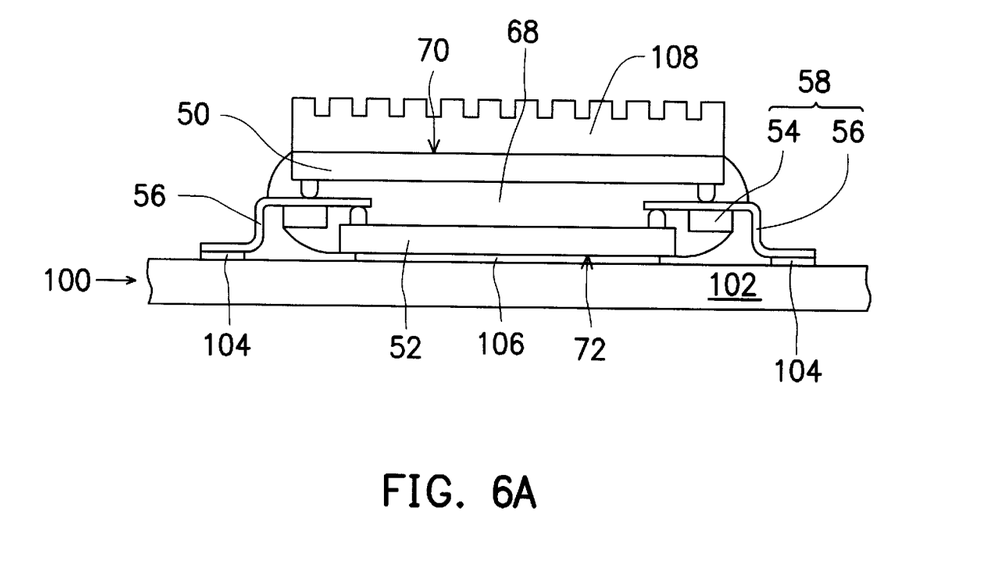
FIG. 6A and FIG. 6B are cross sectional views of applying a multi-chip chip scale package in the invention to a printed circuit board.
Figure 6B:
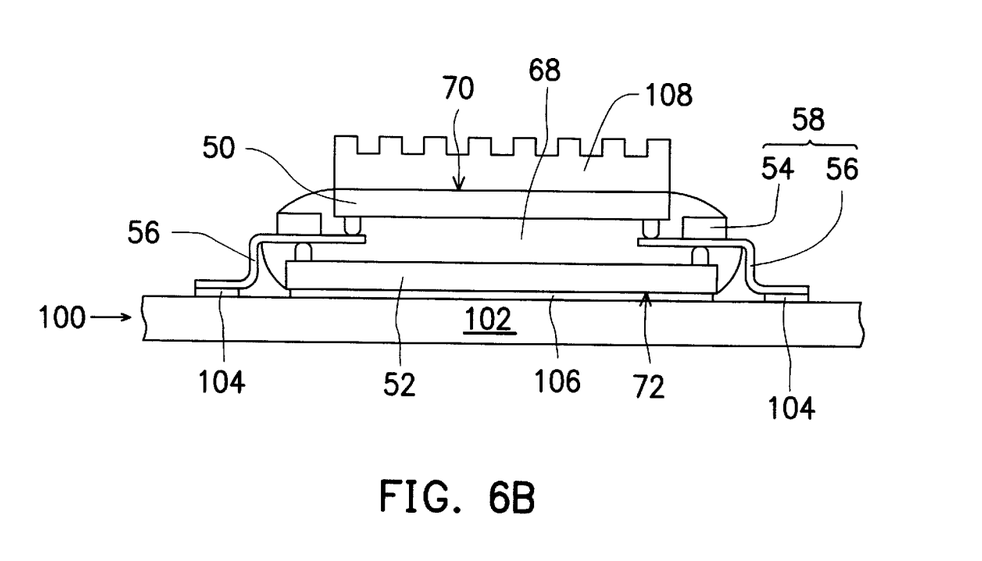

FIG. 6A and FIG. 6B show the application of a multi-chip chip scale package on a printed circuit board. A printed circuit board 100 typically comprises a substrate 102 and printed circuits 104 and 106. The substrate 102 is, for example, a multi-level printed circuit board formed by lamination. The material of the printed circuits includes, for example, copper foil. In the invention, the printed circuit board 100 electrically connects with the conductive wires 56 of the film carrier 58 directly. Thus, the signal transmission path is shorter compared to the prior technique which achieve the connection between the conductive wires of the film carrier and the printed circuit board 100 by, for example, surface mount technique. In the invention, the insulation material 68 is infilled between the chips 50, 52 to leave the surfaces 70, 72 exposed. While disposing the package of the chip 50, 52 onto the printed circuit board 100, the surface 72 of the chip 52 may directly connected to the printed circuit as shown in FIG. 6A and FIG. 6B. While the surface 72 of the chip 52 is in contact with the printed circuit board 100, an enhanced path for heat dissipation is provided. For example, the printed circuit 106 may be connected with the ground on the printed circuit 106 to enlarge the surface area. As a consequence, the heat dissipation effect is improved. In addition, a heat dissipating apparatus 108 such as a heat sink or a heat spreader may be installed over the surface 70 of the chip 50 at a far side of the printed circuit 100 to provide a heat dissipation path for the chip 50. In FIG. 6B, the package is turned up side down while disposed on the printed circuit board 100.

It is to be noted that using the film carrier, a test of the chip package can be performed during packaging process without employing the conventional known-good die method. Thus, the cost can be reduced.

In summary, the advantages of the invention includes at least:

1) The thickness and surface area are reduced by the application of multi-chip chip scale package. The size of the package is only slightly larger than the chip dimension.

2) The conductive wires of the film carrier directly electrically connect to the chip for signal transmission, so that the signal transmission path between the chip and the printed circuit board is shortened, the performance of the chip is thus enhanced.

3) The invention adapts the bared-chip package, so that the performance of heat dissipation is enhanced. The heat can be dissipated by ways of the printed circuit on the printed circuit board, metal plate, or additional heat dissipation apparatus.

4) The package test can be performed directly to the chip while being packaged without performing the process of known-good die.

5) The formation of locating holes improves the fixture of infilled insulation material between the chip and the film carrier, so that the chip can be disposed on the film carrier more stably.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A multi-chip chip scale package, comprising:
    a film carrier, further comprising:
        an insulation film; and
        a plurality of conductive wires, arranged on the insulation film;
    a first chip, disposed on a first side of the insulation film of the film carrier, and having a first bump connecting to one of the conducting wires;
    a second chip, disposed on a second side of the film carrier opposite to the first side, and having a second bump connecting to one of the conducting wires;
    an insulation material, infilled between the first and the second chips on both the first and the second sides of the film carrier; and
    a printed circuit board directly connected to the conducting wires of the film carrier.

2. The package according to claim 1, wherein the first chip has a size smaller than a size of the second chip.

3. The package according to claim 1, wherein the film carrier further comprises at least one locating hole filled by the insulation material.

4. The package according to claim 1, wherein film carrier further comprises a free-floating ring beset by the insulation film to further support the conductive wires.

5. The package according to claim 1, wherein the film carrier further comprises a corner supported ring beset by and connecting to the insulation film.

6. The package according to claim 5, wherein the corner supported ring have a plurality of corners connected with the insulation film.

7. The package according to claim 6, wherein the corners each has at least a locating hole.

8. The package according to claim 1, wherein the first and the second chips each has one bared side, and the other side sealed by the insulation material.

9. A printed circuit board having a package disposed thereon, comprising:
    a substrate; and
    a plurality of printed circuits on the substrate;
    wherein the package comprises:
    a film carrier, further comprising:
        an insulation film; and
        a plurality of conductive wires, arranged on the insulation film, and directly connected to one of the printed circuits;
    a first chip, disposed on a first side having the insulation film of the film carrier, and having a first bump connecting to the film carrier;
    a second chip, disposed on a second side of the film carrier opposite to the first side, and having a second bump connecting to the film carrier, one of the first chip and the second chip is connected to the substrate; and
    an insulation material, infilled between the first and the second chips on both the first and the second sides of the film carrier.

10. The printed circuit board according to claim 9, wherein one of the first and the second chips has a rear surface connecting to at least one of the printed circuits on the substrate, and the other one of the first and the second chips has a bared rear surface.

11. The printed circuit board according to claim 9, wherein a heat dissipation apparatus is installed over the bared rear surface.

12. The printed circuit board according to claim 11, wherein the heat dissipation apparatus comprises a heat spreader.

13. The printed circuit board according to claim 11, wherein the heat dissipation apparatus comprises a heat sink.

14. The printed circuit board according to claim 9, wherein the insulation film further comprises at least a locating hole filled by the insulation material.

15. The printed circuit board according to claim 9, wherein the substrate comprises a multi-level printed circuit board.

16. The printed circuit board according to claim 9, wherein film carrier further comprises a free-floating ring beset by the insulation film to further support the conductive wires.

17. The package according to claim 9, wherein the film carrier further comprises a corner supported ring beset by and connecting to the insulation film.

18. The package according to claim 9, wherein the corner supported ring have a plurality of corners connected with the insulation film.

19. The package according to claim 9, wherein the corners each has at least a locating hole.

* * * * *